US012799316B2

(12) United States Patent
Andre et al.

(10) Patent No.: US 12,799,316 B2
(45) Date of Patent: Nov. 17, 2026

(54) POLYMER COMPOSITION COMPRISING PARTICLES AND COLORANT, ITS METHOD OF PREPARATION AND ITS USE

(71) Applicant: Trinseo Europe GmbH, Horgen (CH)

(72) Inventors: Benoit Andre, Serquigny (FR); Sylvain Queruel, Serquigny (FR); Peter Vlottes, Laharlingen (NL); Jean-Marc Boutillier, Lacq (FR)

(73) Assignee: Trinseo Europe GmbH, Pfaeffikon (CH)

( * ) Notice: Subject to any disclaimer, the term of this patent is extended or adjusted under 35 U.S.C. 154(b) by 918 days.

(21) Appl. No.: 17/286,923

(22) PCT Filed: Oct. 25, 2019

(86) PCT No.: PCT/EP2019/079147

§ 371 (c)(1),
(2) Date: Apr. 20, 2021

(87) PCT Pub. No.: WO2020/084108

PCT Pub. Date: Apr. 30, 2020

(65) Prior Publication Data

US 2021/0371640 A1 Dec. 2, 2021

(30) Foreign Application Priority Data

Oct. 26, 2018 (FR) ....................................... 1859963

(51) Int. Cl.

| | |
|---|---|
| ***C08L 33/12*** | (2006.01) |
| ***B29C 45/00*** | (2006.01) |
| ***B29C 48/00*** | (2019.01) |
| ***B29K 33/00*** | (2006.01) |
| ***B29K 105/00*** | (2006.01) |
| ***C08J 3/22*** | (2006.01) |
| ***C08L 33/06*** | (2006.01) |
| ***G02B 5/02*** | (2006.01) |
| ***H10H 20/852*** | (2025.01) |

(52) U.S. Cl.

CPC ................. *C08L 33/12* (2013.01); *C08J 3/22* (2013.01); *C08L 33/06* (2013.01); *G02B 5/0242* (2013.01); *H10H 20/852* (2025.01); *B29C 45/0001* (2013.01); *B29C 48/022* (2019.02); *B29K 2033/12* (2013.01); *B29K 2105/0032* (2013.01); *C08L 2205/14* (2013.01); *C08L 2310/00* (2013.01)

(58) Field of Classification Search

CPC ......... G02B 5/02; G02B 5/0242; C08L 33/00; C08K 5/0041

See application file for complete search history.

(56) References Cited

U.S. PATENT DOCUMENTS

| | | | | |
|---|---|---|---|---|
| 5,066,099 A * | 11/1991 | Yoshida | G03B 21/625 | 359/453 |
| 5,307,205 A * | 4/1994 | Ludwig, Jr. | B32B 27/08 | 359/453 |
| 5,549,941 A * | 8/1996 | Banyay | B29C 43/24 | 526/309 |
| 6,476,158 B1 | 11/2002 | England et al. | | |
| 7,052,161 B2 * | 5/2006 | Lichtenstein | G09F 13/04 | 362/311.04 |
| 8,568,884 B2 | 10/2013 | Okada et al. | | |
| 9,817,154 B2 | 11/2017 | Kawaguchi | | |
| 10,935,697 B2 | 3/2021 | Sugawara et al. | | |
| 2006/0018015 A2 | 1/2006 | Parusel et al. | | |
| 2006/0175735 A1 | 8/2006 | Hoess et al. | | |
| 2007/0055017 A1 | 3/2007 | Schultes et al. | | |
| 2009/0146548 A1 | 6/2009 | Lichtenstein et al. | | |
| 2009/0156732 A1 | 6/2009 | Rajaraman et al. | | |
| 2011/0136964 A1 | 6/2011 | Golchert et al. | | |
| 2012/0181489 A1 | 7/2012 | Garcia-Leiner et al. | | |
| 2014/0000300 A1 | 1/2014 | Ito et al. | | |
| 2014/0003060 A1 | 1/2014 | Okada et al. | | |
| 2015/0016804 A1 | 1/2015 | Biderman et al. | | |
| 2015/0168604 A1 * | 6/2015 | Guo | G02B 1/04 | 252/582 |

(Continued)

FOREIGN PATENT DOCUMENTS

| | | |
|---|---|---|
| CN | 101336268 A | 12/2008 |
| CN | 101446650 A | 6/2009 |

(Continued)

OTHER PUBLICATIONS

Machine translation of JP 2004-284038 (2004, 23 pages).*
Macrolex Dyes (Macrolex Dyes-Product Range and Properties, Lanxess, 2021, 20 pages).*
Machine translation of JP 11-60966 (1999, 4 pages).*
Chinese Office Action for Chinese Application No. 201980086193.8, dated Jun. 10, 2022, with translation, 10 pages.
Chinese Office Action for Chinese Application No. 201980086193.8, dated Aug. 12, 2023 with translation, 8 pages.
Mauro Moca, et al., "Warm white LED light byfrequency down-conversion of mixed yellow and red Lumogen", Visual Communications and Image Processing; Jan. 20, 2004, San Jose, vo. 8767, May 22, 2013, p. 87670 L.

(Continued)

*Primary Examiner* — Brieann R Johnston
(74) *Attorney, Agent, or Firm* — Buchanan Ingersoll & Rooney PC

(57) ABSTRACT

A polymer composition comprising particles and colorant, its method of preparation and its use. The present invention relates to a polymeric composition comprising polymeric particles and a colorant. In particular the present invention relates to a polymeric (meth)acrylic composition comprising polymeric particles and a mixture of colorants. The present invention concerns also the use of such a polymeric composition or polymeric (meth)acrylic composition comprising polymeric particles and a mixture of colorants in lighting applications. The present invention concerns also a process for making a polymeric composition or (meth)acrylic composition comprising polymeric particles and a mixture of colorants.

11 Claims, 3 Drawing Sheets

(56) References Cited

U.S. PATENT DOCUMENTS

Figure 1:
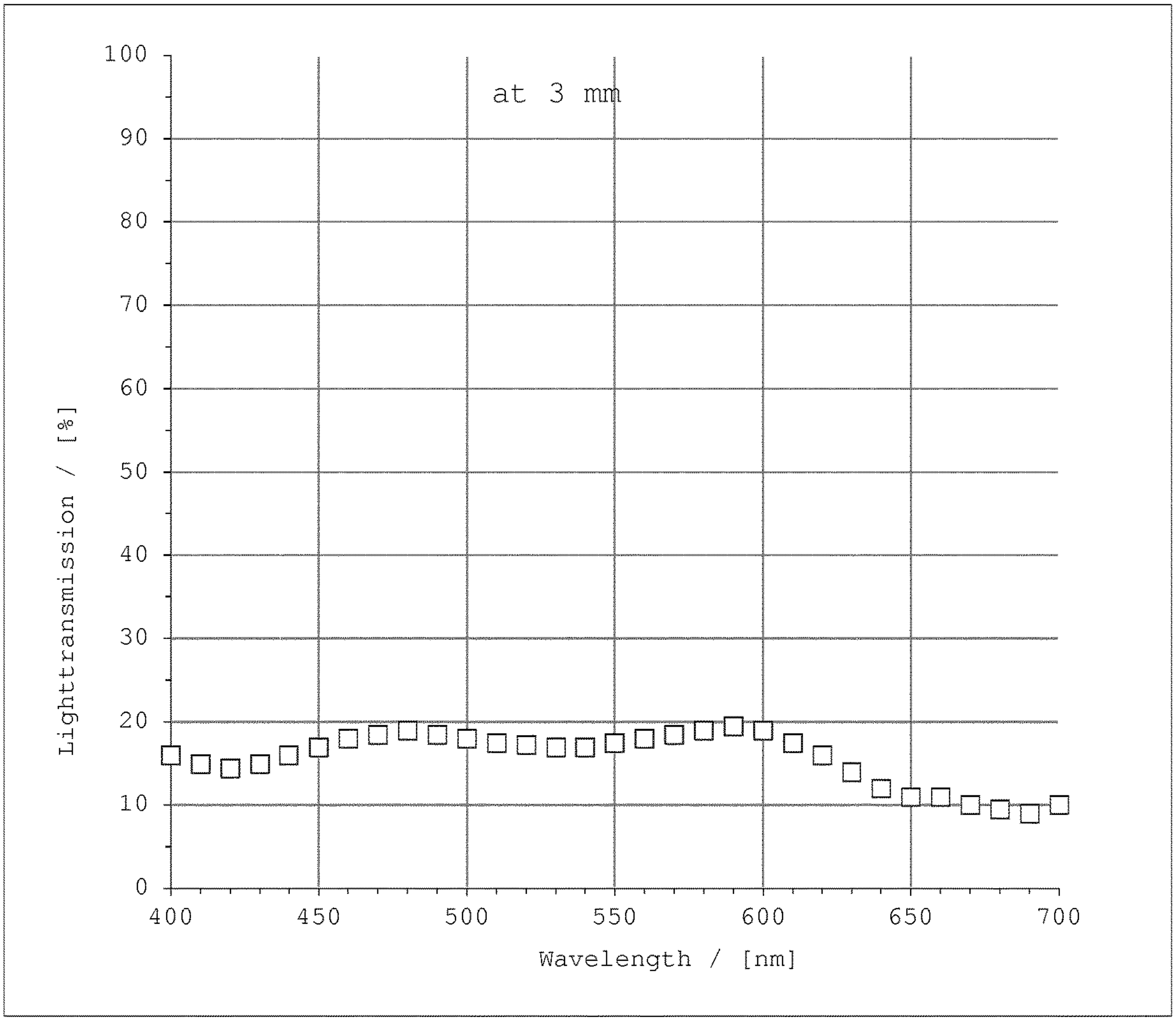

| | | | | |
|---|---|---|---|---|
| 2015/0267891 | A1 | 9/2015 | Burchill et al. | |
| 2015/0355536 | A1 * | 12/2015 | Pudleiner | B32B 27/40 156/244.11 |
| 2018/0052280 | A1 | 2/2018 | Ge et al. | |
| 2020/0363036 | A1 | 11/2020 | Ge et al. | |
| 2021/0102058 | A1 * | 4/2021 | Kogler | C08L 33/12 |

FOREIGN PATENT DOCUMENTS

| | | | | |
|---|---|---|---|---|
| CN | 103391974 | A | 11/2013 | |
| CN | 104520360 | A | 4/2015 | |
| CN | 108467552 | A | 8/2018 | |
| EP | 3 438 142 | A1 | 2/2019 | |
| JP | S53-115767 | A | 10/1978 | |
| JP | 06111612 | A | 4/1994 | |
| JP | 11060966 | A * | 3/1999 | C08L 101/00 |
| JP | 2004284038 | A * | 10/2004 | |
| JP | 2012-208465 | A | 10/2012 | |
| JP | 2016060755 | A | 4/2016 | |
| JP | 2016103017 | A | 6/2016 | |
| WO | 2004/042471 | A1 | 5/2004 | |
| WO | 2004/098857 | A1 | 11/2004 | |
| WO | 2005/047391 | A1 | 5/2005 | |
| WO | WO 2006/100127 | A2 | 9/2006 | |
| WO | 2007/054532 | A2 | 5/2007 | |
| WO | 2007058810 | A2 | 5/2007 | |
| WO | 2007067462 | A1 | 6/2007 | |
| WO | 2010/020474 | A1 | 2/2010 | |
| WO | WO-2011134674 | A1 * | 11/2011 | C08L 69/00 |
| WO | 2012/130594 | A1 | 10/2012 | |
| WO | 2014/025657 | A1 | 2/2014 | |
| WO | 2014/055330 | A2 | 4/2014 | |
| WO | 2017/169931 | A1 | 10/2017 | |
| WO | 2018151030 | A1 | 8/2018 | |

OTHER PUBLICATIONS

Niko, A., etal: "White Light and red-green-blue (RGB) electroluminescence by light color-conversion", Optical Materials, , Elsevier Science Publishers, B.V. Amsterdam, N.L., vol. 19, No. 1-4, Jan. 1, 1998, p. 181-191.

Chinese Office Action for Chinese Application No. 201980086193.8, dated Nov. 10, 2023 with translation, 6 pages.

Chinese Office Action for Chinese Application No. 201980086193.8, dated Jan. 20, 2023 with translation, 13 pages.

European Communication pursuant to Article 94(3) for European Application No. 19 790 223.2, dated Dec. 16, 2022, 3 pages.

Japanese Notice of Reasons for Rejection for Japanese Application No. 2021-522365, dated Nov. 7, 2023 with partial translation, 15 pages.

Office Action (Notice of Grounds for Rejection) issued Jun. 3, 2024, by the Korean Intellectual Property Office in Corresponding Korean Patent Application No. 10-2021-7015226 and an English translation of the Office Action. (12 pages).

Mexican Substantive Examination issued Jul. 16, 2025, by the Mexican Institute of Industrial Property in corresponding Mexican Application No. MX/a/2021/004486 with an English translation. (8 pages).

Vieweg et al., "Polymethacrylate, Kunststoff-Handbuch Band IX", München, (Month unknown 1975), pp. 38-41, 226-227 and 502-503.

"Sudanfarbstoffe" Wikipedia, https://de.wikipedia.org/wiki/Sudanfarbstoffe, (Jul. 24, 2025), pp. 1-5.

Online brochure, "Waxoline TM Solvent Soluble Dyes for Plastic" (Month unknown 2021), https://waxoline.com/wp-content/uploads/2021/11/Kadion-Waxoline-digital-version.pdf. (8 pages).

Communication of notice of opposition (R. 79(1) EPC) issued Sep. 25, 2025, by the European Patent Office in corresponding European Patent Application No. 19790223.2-1102 and its English translation. (71 pages).

* cited by examiner

POLYMER COMPOSITION COMPRISING PARTICLES AND COLORANT, ITS METHOD OF PREPARATION AND ITS USE

This application claims benefit, under U.S.C. § 119 or § 365 of PCT Application Number PCT/EP2019/079147, filed Oct. 25, 2019, and French Patent Application Number FR18.59963, filed Oct. 26, 2018, these documents being incorporated herein by reference.

FIELD OF THE INVENTION

The present invention relates to a polymeric composition comprising polymeric particles and a colorant.

In particular the present invention relates to a polymeric (meth)acrylic composition comprising polymeric particles and a mixture of colorants.

The present invention concerns also the use of such a polymeric composition or polymeric (meth)acrylic composition comprising polymeric particles and a mixture of colorants in lighting applications.

The present invention concerns also a process for making a polymeric composition or (meth)acrylic composition comprising polymeric particles and a mixture of colorants.

Technical Problem

Thermoplastic polymers and especially (meth)acrylic polymers are widely used, including lighting applications. This is mainly due to its characteristics as a highly transparent polymer material with excellent resistance to ultraviolet radiation and weathering. So (meth)acrylic polymers are used for example in lamps, luminaires, light covers, displays, lit shelving, surfaces and illuminated signs.

The lighting applications have various requests on the (meth)acrylic polymers or the compositions based on (meth) acrylic polymers as light transmission, diffusing power. These compositions based on (meth)acrylic polymers comprise generally more or less spherical particles, which are also polymeric particles or other organic particles or inorganic particles.

Additionally it is of also of great interest to have a polymeric composition with a good compromise between light transmission and diffusing properties, hiding the light source and that the light or coloured light is transmitted and diffused when the light source is switched on. Last point is especially important for lighting applications where it is for example required that a sign is to be visible in the daytime when the light source is off or not necessarily switched on; but also at night, or in half-darkness, when the light source is switched on.

This compromise is based on the correct or optimal quantity of the respective particles in the polymeric composition and colorants in the polymeric composition.

Therefore it is important to have a polymeric composition that contains polymeric particles and colorants that can be used in lighting devices that comprises LEDs that can hide the light source and that light or coloured light is transmitted and diffused when the light source is switched on.

The objective of the present invention is to provide a polymeric composition comprising polymeric particles and colorants suitable for lighting applications.

An additional objective of the present invention is to provide a polymeric composition comprising polymeric particles and colorants for lighting applications giving an aspect contrast and/or color contrast independent of the color of lighting source by using the same polymeric composition.

Another objective of the present invention is to provide a polymeric composition comprising polymeric particles and colorants that the composition, when used in a lighting application and the light source is lit on, a lighting device comprising said composition can transmit light over the whole range of wavelength of visible light.

Again still another objective of the present invention is to provide a luminous device comprising a light source and a polymeric composition comprising polymeric particles and colorants that when the light source is lit on, it is hidden and can transmit light over the whole range of wavelength of visible light.

BACKGROUND OF THE INVENTION

Prior Art

The diffusion of light which increases the relative diffusion power and the hiding power is usually increased by adding scattering particles to the composition.

The document EP 1864274 discloses an illuminating device combining a LED and a diffusing sheet. The luminous device comprises at least one light-emitting diode and at least one cover made of a transparent plastic in which particles that scatter the light emitted by the light-emitting diode are dispersed.

The document EP 1927098 discloses an illuminating device combining a white LED and a diffusing sheet. The luminous device comprises at least one white light-emitting diode and at least one cover made of a transparent plastic in which particles that scatter the light emitted by the light-emitting diode are dispersed The document US 2016/0245954 discloses an optical diffusion blend material for LED lighting. The diffusing blend comprises a mixture of inorganic particles and organic particles.

The document WO2004/098857 discloses an injection molding method for the production of light diffusing molded items. The molding material comprises a matrix of polymethyl methacrylate and spherical plastic particles with a particle size of 1 to 24 μm.

The prior art does not discloses polymeric composition comprising polymeric particles and a mixture of colorants at the same time.

BRIEF DESCRIPTION OF THE INVENTION

Surprisingly it has been discovered that a polymeric composition PC1 comprising:

a) a polymer P1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1;

possesses a sufficient hiding power in lightning applications and provides a homogenous light diffusion.

Surprisingly it has been discovered that a polymeric composition PC1 comprising:

a) a polymer P1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1;

is suitable for a cover in lighting applications providing a sufficient hiding power and homogenous light diffusion.

Surprisingly it has been discovered that a polymeric composition PC1 comprising:

a) a polymer AP1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1;

can be used in lighting applications for providing a sufficient hiding power and homogenous light diffusion.

It has also been found that a process for obtaining a polymeric composition PC1, said composition PC1 comprises:

a) a polymer P1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1;

said process comprises the step of i) providing:

a) a (meth)acrylic polymer AP1, b) polymeric particles PP1 having a weight average particle diameter between 1 μm and 100 μm, c) colorants $CA_1$ to $CA_n$ ii) blending the three components a), b) and c)

yields to a polymeric composition providing a sufficient hiding power and a homogenous light diffusion in lighting applications.

DETAILED DESCRIPTION OF THE INVENTION

According to a first aspect, the present invention relates to a polymeric composition PC1 comprising:

a) a polymer P1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1.

According to a second aspect, the present invention relates to a polymeric composition PC1 comprising:

a) a (meth)acrylic polymer AP1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1

According to a third aspect, the present invention relates to a process for manufacturing a polymeric composition PC1, said composition PC1 comprises:

a) a polymer P1, b) a polymeric particle PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1;

said process comprises the step of i) providing:

a) a polymer P1, b) polymeric particles PP1 having a weight average particle diameter between 1 μm and 100 μm, c) colorants $CA_1$ to $CA_n$ ii) blending the three components a), b) and c).

According to a fourth aspect, the present invention relates to the use of a polymeric composition PC1 comprising:

a) a polymer P1, b) polymeric particles PP1 having a weight average particle diameter between 1 μm and 100 μm, c) colorants $C_A$, to $CA_n$, characterized in that the colorant is mixture of colorants $CA_1$ to $CA_n$ with n>1 in the composition PC1, in lighting applications.

According to a fifth aspect, the present invention relates to a lighting device comprising a polymeric composition PC1 comprising:

a) a polymer P1, b) polymeric particles PP1 having a weight average particle diameter between 1 μm and 100 μm, c) colorants $CA_1$ to $CA_n$, characterized in that the colorant is mixture of colorants $CA_1$ to $CA_n$ with n>1 in the composition PC1.

According to still another aspect the present invention relates to a process for manufacturing a lighting device, said process comprises the steps of:

i) providing a polymeric composition PC1 comprising a) a polymer P1 b) a polymeric particles PP1 having a weight average particle diameter between 1 μm and 100 μm c) colorants $CA_1$ to $CA_n$, characterized in that the colorant is mixture of colorants $CA_1$ to $CA_n$ with n>1 in the composition PC1 ii) making a cover for the lighting device comprising polymeric composition PC1 iii) combining the cover with a light source.

By the term "alkyl(meth)acrylate" as used is denoted to both alkyl acrylate and alkyl methacrylate.

By the term "copolymer" as used is denoted that the polymers consists of at least two different monomers.

By the term "parts" as used herein is denoted "parts by weight".

By the term "thermoplastic polymer" as used is denoted a polymer that turns to a liquid or becomes more liquid or less viscous when heated and that can take on new shapes by the application of heat and pressure.

By the term "(meth)acrylic polymer" as used in the present invention is denoted a polymer with weight ratio of acrylic or methacrylic monomers inside the (meth)acrylic polymer of at least 50 wt %.

By the term "PMMA" as used in the present invention are denoted homo- or copolymers of methyl methacrylate (MMA), for the copolymer of MMA the weight ratio of MMA inside the PMMA is at least 50 wt %.

By the term "masterbatch" as used is understood composition that comprises an additive in high concentration in a carrier material. The additive is dispersed in the carrier material.

By saying that a range from x to y in the present invention, it is meant that the upper and lower limit of this range are included, equivalent to at least x and up to y.

By saying that a range is between x and y in the present invention, it is meant that the upper and lower limit of this range are excluded, equivalent to more than x and less then y.

With regard to the polymeric composition PC1 according to the invention it comprises a polymer P1, polymeric particles PP1 having a weight average particle diameter between 1 μm and 100 μm and colorants $CA_1$ to $CA_n$ characterized in that the colorant is mixture of colorants $CA_1$ to $CA_n$ with n>1 in the composition PC1. In other words there are at least two different colorants $CA_1$ and $CA_2$ in the polymeric composition PC1.

The polymer P1 is chosen from can be chosen from (meth) acrylic polymers, polycarbonate, polystyrenes, polyesters, polyvinylchloride (PCV), cyclic olefin copolymers, styrene methyl methacrylate (SMMA), styrene acrylonitrile (SAN), polyvinylidene fluoride (PVDF) and blends thereof.

Preferably the polymer P1 is chosen from (meth) acrylic polymers, so that the polymer P1 is a (meth)acrylic polymer AP1.

In a first preferred embodiment the polymeric composition PC1 comprises a) a (meth)acrylic polymer AP1, b) polymeric particles PP1 having a weight average particle diameter between 1 μm and 100 μm and c) colorants $CA_1$ to $CA_n$, is characterized in that the particle PP1 represents between 0.05 wt % and 50 wt % of the polymeric composition PC1 comprising the components a), b) and c). However the weight ratios of the particles of component b) is calculated on the sum of the two components a) and b) only. More preferred according to the first preferred embodiment, the particle PP1 represents between 0.1 wt % and 40 wt %, still more preferred between 0.7 wt % and 30 wt % and advantageously between 0.8 wt % and 20 wt % of the composition PC1 calculated on the sum of the two components a) and b) only.

The light transmission for a composition comprising a) and b) for a sheet of 3 mm thickness is at least 80%. The light transmission is measured according to the norm ASTM D1003.

In a second preferred embodiment the polymeric composition PC1 comprises at least one additional colorant CB, which if different from any of the colorants $CA_1$ to $CA_n$ already present in the polymeric composition PC1.

In a third preferred embodiment the polymeric composition PC1 comprises a) a (meth)acrylic polymer AP1, b) polymeric particles PP1 having a weight average particle diameter between 1 μm and 100 μm and c) colorants $CA_1$ to $CA_n$ and at least one additional colorant CB, which if different from any of the colorants $CA_1$ to $CA_n$ already present in the polymeric composition PC1, is characterized in that the particle PP1 represents between 0.05 wt % and 50 wt % of the polymeric composition PC1 comprising the components a), b) and c) is calculated on the sum of the two components a) and b) only.

With regard to the (meth)acrylic polymer AP1 it is a (meth)acrylic block copolymer MBC or a (meth)acrylic polymer MP1.

In a first preferred embodiment the (meth)acrylic polymer AP1 is a (meth)acrylic polymer composition MP1.

The (meth)acrylic polymer composition MP1 comprises a polymeric polymer chain comprising at least 50 wt % of monomers coming acrylic and/or methacrylic monomers. The (meth)acrylic polymer could also be a mixture of two or more (meth)acrylic polymer MP1 to MPx.

The acrylic and/or methacrylic monomers are chosen from acrylic acid, methacrylic acid, esters of acrylic acid of esters of methacrylic acid, alkyl acrylic monomers, alkyl methacrylic monomers and mixtures thereof.

Preferably the monomer is chosen from acrylic acid, methacrylic acid, alkyl acrylic monomers, alkyl methacrylic monomers and mixtures thereof, the alkyl group having from 1 to 22 carbons, either linear, branched or cyclic; preferably the alkyl group having from 1 to 12 carbons, either linear, branched or cyclic.

Advantageously the meth)acrylic monomer is chosen from methyl methacrylate, ethyl methacrylate, methyl acrylate, ethyl acrylate, methacrylic acid, acrylic acid, n-butyl acrylate, iso-butyl acrylate, n-butyl methacrylate, iso-butyl methacrylate, cyclohexyl acrylate, cyclohexyl methacrylate, isobornyl acrylate, isobornyl methacrylate and mixtures thereof.

Other comonomers can be copolymerized with the acrylic and/or methacrylic monomers as long as the (meth)acrylic polymer AP1 is comprising at least 50 wt % of monomers coming acrylic and/or methacrylic monomers in its polymeric chain. The other comonomers can be chosen from styrenic monomers as styrene or styrene deriviatives, acrylonitrile, vinylesters as vinylacetate. The amount of these comonomers is from 0 wt % to 50 wt %, preferably from 0 wt % to 40 wt %, more preferably from 0 wt % to 30 wt %, advantageously from 0 wt % to 20 wt %.

In a first preferred embodiment the (meth)acrylic polymer composition MP1 is a homo- or copolymer of methyl methacrylate (MMA) that comprises at least 50%, preferably at least 60%, advantageously at least 70% and more advantageously at least 80% by weight of methyl methacrylate.

The copolymer of methyl methacrylate (MMA) comprises between 50% and 99.9% by weight of methyl methacrylate and between 0.1 and 50% by weight of at least one monomer having at least one ethylenic unsaturation that can copolymerize with methyl methacrylate.

These monomers are well known and mention may be made, in particular of acrylic and methacrylic acids and alkyl-(meth)acrylates in which the alkyl group has from 1 to 12 carbon atoms. As examples, mention may be made of methyl acrylate and ethyl, butyl or 2-ethylhexyl (meth) acrylate. Preferably the comonomer is an alkyl acrylate in which the alkyl group having from 1 to 4 carbon atoms.

According to the first more preferred embodiment the copolymer of methyl methacrylate (MMA) comprises from 80% to 99.8% advantageously from 90% to 99.7% and more advantageously from 90% to 99.5% by weight of methyl methacrylate and from 0.2% to 20% advantageously from 0.3% to 10% and more advantageously from 0.5% to 10% by weight of at least one monomer having at least one ethylenic unsaturation that can copolymerize with methyl methacrylate. Preferably the comonomer is chosen from methyl acrylate or ethyl acrylate or mixtures thereof.

The (meth)acrylic polymer composition MP1 has a melt flow index (MFI) according to ISO 1133 (230° C./3.8 kg) between 0.1 g/10 min and 20 g/10 min. Preferably melt flow index is between 0.2 g/10 min and 18 g/10 min, more preferably between 0.3 g/10 min and 16 g/10 min, advantageously between 0.4 g/10 min and 13 g/10 min.

The (meth)acrylic polymer composition MP1 has a refractive index between 1.46 and 1.52, preferably between 1.47 and 1.52 and more preferably between 1.48 and 1.52.

The (meth)acrylic polymer composition MP1 has a light transmittance according to ASTM D-1003 (sheet of 3 mm thickness) of at least 85%, preferably 86%, more preferably 87%.

The (meth)acrylic polymer composition MP1 has a Vicat softening temperature of at least 90° C. The Vicat softening temperature is measured according to ISO 306:2013 (B50 method).

The composition according to the invention can comprise beside the (meth)acrylic polymer MP1 also an (meth)acrylic polymer MP2. The (meth)acrylic polymer MP1 and (meth) acrylic polymer MP2 form a mixture or a blend. This mixture or blend consists of at least one homopolymer and at least one copolymer of MMA, or a mixture of at least two homopolymers or two copolymers of MMA with a different average molecular weight or a mixture of at least two copolymers of MMA with a different monomer composition.

According to a second preferred embodiment the (meth) acrylic polymer AP1 it is a (meth)acrylic block copolymer MBC.

The (meth)acrylic block copolymer MBC comprises at least 50% of monomers coming acrylic and/or methacrylic monomers.

The (meth)acrylic block copolymer MBC comprises at least one block having a glass transition temperature less than 20° C. preferably less than 10° C. more preferably less than 0° C., advantageously less than −5° C. and more advantageously less than −10° C.

Preferably (meth)acrylic block copolymer MBC comprises at least one block which is an (meth)acrylic block. By this is meant that at least 50 wt % of the monomers inside this block are alkyl (meth)acrylate monomers, that have been polymerized.

Most preferably the (meth)acrylic block copolymer MBC comprises least 50 wt % of the monomers inside (meth) acrylic block copolymer MBC are alkyl(meth)acrylate monomers, that have been polymerized.

The (meth)acrylic block copolymer MBC is having a general formula $(A)_nB$ in which:

n is an integer of greater than or equal to 1,

A is: an acrylic or methacrylic homo- or copolymer having a Tg of greater than 50° C., preferably of greater than 80° C., or polystyrene, or an acrylic/styrene or methacrylic/styrene copolymer. Preferably, A is chosen from methyl methacrylate (MMA), phenyl methacrylate, benzyl methacrylate or isobornyl methacrylate. Preferably, the block A is PMMA or PMMA modified with acrylic or methacrylic comonomers;

B is an acrylic or methacrylic homo- or copolymer having a Tg of less than 20° C., preferably comprising monomers chosen of methyl acrylate, ethyl acrylate, butyl acrylate (BuA), ethylhexyl acrylate, styrene (Sty) or butyl methacrylate, more preferably butyl acrylate said monomers make up at least 50 wt %, preferably 70 wt % of B.

Advantageously the (meth)acrylic block copolymer MBC is amorphous.

Preferably, in the block A the monomer is chosen from methyl methacrylate (MMA), phenyl methacrylate, benzyl methacrylate, isobornyl methacrylate, styrene (Sty) or alpha-methylstyrene or mixtures thereof. More preferably, the block A is PMMA or PMMA copolymerized with acrylic or methacrylic comonomers or polystyrene (PS) or PS modified with styrenic comonomers.

Preferably the block B comprises monomers chosen of methyl acrylate, ethyl acrylate, butyl acrylate (BuA), ethylhexyl acrylate or butyl methacrylate and mixtures thereof, more preferably butyl acrylate said monomers make up at least 50 wt %, preferably 70 wt % of block B.

Furthermore, the blocks A and/or B can comprise other acrylic or methacrylic comonomers carrying various chemical function groups known to a person skilled in the art, for example acid, amide, amine, hydroxyl, epoxy or alkoxy functional groups. The block A can incorporate groups, such as acrylic acid or methacrylic acid (MAA), in order to increase the temperature stability of thereof.

Comonomers like styrene can also be incorporated in the block B in order to mismatch the refractive index of the block A.

Preferably, said thermoplastic acrylic block copolymer has a structure chosen from: ABA, AB, $A_3B$ and $A_4B$.

The (meth)acrylic block copolymer MBC for example can be one of the following triblock copolymers: pMMA-pBuA-pMMA, p(MMAcoMAA)-pBuA-p (MMAcoMAA), p(MMAcoMAA)-p(BuAcoSty)-p(MMAcoMAA) and p(MMAcoAA)-pBuA-p(MMAcoAA). In a first preferred embodiment, the (meth)acrylic block copolymer MBC is p(MMAcoMAA)-p(BuAcoSty)-p(MMAcoMAA).

It is known to a person skilled in the art that the polymers of PMMA type can comprise small amounts of acrylate comonomer in order to improve the temperature stability thereof. By small is meant less than 9 wt %, preferably less than 7 wt % and more preferably less than 6 wt % of the polymer.

The block B represents from 10% to 85%, preferably 15% to 80% of the total weight of the block copolymer MBC.

The block B has a weight-average molar mass of between 10 000 g/mol and 500 000 g/mol, preferably from 20 000 g/mol to 300 000 g/mol. The weight average molar mass can be measured by size exclusion chromatography (SEC).

The (meth)acrylic block copolymers can be obtained by controlled radical polymerization (CRP) or by anionic polymerization; the most suitable process according to the type of copolymer to be manufactured will be chosen.

Preferably, this will be CRP, in particular in the presence of nitroxides, for the (meth)acrylic block copolymers of $(A)_nB$ type and anionic or nitroxide radical polymerization, for the structures of ABA type, such as the triblock copolymer MAM. Controlled radical polymerization is described in the document for obtaining block copolymers, i.e. in WO03/062293.

The (meth)acrylic block copolymer MBC can be transformed by extrusion or injection molding in form of a object.

According to a third preferred embodiment the (meth) acrylic polymer AP1 it is a blend of a (meth)acrylic block copolymer MBC with a (meth)acrylic polymer MP1.

With regard to the polymeric particles PP1, it is having a weight average particle diameter between 1 μm and 100 μm, preferably a weight average particle diameter between 1 μm and 90 μm, more preferably between 1 μm and 80 μm, advantageously between 1 μm and 70 μm and most advantageously between 1 μm and 60 μm.

The polymeric particle PP1 can also be a mixture of different kind of particles. Either it can be particles of the same chemical nature having a different weight average particle diameter, as long as both are within the interval between 1 μm and 100 μm for weight average particle diameter. Or it can be particles of different chemical nature having the same or a different weight average particle diameter, as long as both are within the interval between 1 μm and 100 μm for the weight average particle diameter.

With regard to the polymeric particles PP1 they can be chosen from silicone particles, (meth)acrylic particles, styrenic particles and mixtures thereof. The particles can be crosslinked or partly crosslinked. The polymeric particles PP1 can be mixtures of different kind of particles.

With regard to the polymeric silicone particle as polymeric particles PP1, it is having a weight average particle diameter between 1 μm and 20 μm. In a first preferred embodiment the silicone particles PP1 comprises polysiloxanes chains having a silicone-oxygen backbone chain.

The polymeric silicone particle PP1 has a refractive index between 1.30 and 1.45, preferably between 1.35 and 1.45, advantageously between 1.36 and 1.44.

In a first preferred embodiment the weight average particle diameter of the polymeric silicone particle PP1 is preferably between 1 μm and 15 μm, more preferably between 1 μm and 8 μm, still more preferably between 1 μm and 7 μm, even more preferably between 1 μm and 6 μm, advantageously between 1 μm and 5 μm and more advantageously between 1 μm and 4 μm.

The bulk density of a powder of the polymeric silicone particle PP1 is between 0.1 g/ml and 0.5 g/ml, preferably between 0.151 g/ml and 0.47 g/ml.

The polymeric silicone particle PP1 can for example be prepared according to US 2008/124549.

The polymeric silicone particle could also be a blend of two or more different silicone particles PP1a, PP1b . . . , as long as all silicone particles have the before mentioned characteristics.

With regard to the polymeric (meth)acrylic particles as polymeric particles PP1, they are having a weight average particle diameter between 1 μm and 100 μm, it comprises at least 50 wt % of monomers coming from acrylic and/or methacrylic monomers in the polymer chains of the polymeric particle PP2.

In a first preferred embodiment the polymeric (meth) acrylic particle PP1 is a homo- or copolymer of methyl methacrylate (MMA) that comprises at least 50%, preferably at least 60%, advantageously at least 65% and more advantageously at least 70% by weight of methyl methacrylate.

The weight average particle diameter of the polymeric (meth)acrylic particle PP1 is preferably between 1 μm and 90 μm, more preferably between 2 μm and 80 μm and advantageously between 2 μm and 60 μm.

Preferably the polymeric (meth)acrylic particle PP1 is crosslinked. The weight ratio of the crosslinker in the (meth)acrylic particle PP1 is less than 5 wt %. The crosslinker is preferably chosen from an organic compound having at least one acrylic or methacrylic function and a second double bond which can polymerize as well.

The polymeric (meth)acrylic particle PP1 has a refractive index between 1.49 and 1.56, preferably between 1.50 and 1.55.

The polymeric (meth)acrylic particle PP1 can be prepared according to suspension polymerization.

The polymeric (meth)acrylic particle could also be a blend of two or more different (meth)acrylic particles PP1a, PP1b . . . , as long as all particles have the before mentioned characteristics.

With regard to the colorants CA or $CA_1$ to $CA_n$, it can be a pigment or a dye or a mixture of pigments and dyes. The pigment can be an inorganic pigment or an organic pigment.

In a first preferred embodiment the colorants CA or $CA_1$ to $CA_n$ is a mixture of pigments and dyes.

In a second preferred embodiment the colorants CA or $CA_1$ to $CA_n$ is a mixture of dyes.

In a third preferred embodiment the colorants CA or $CA_1$ to $CA_n$ is a mixture of pigments.

The colorants CA is mixture of colorants $CA_1$ to $CA_n$ with $n>1$. Preferably the value n is $1<n<10$ and more preferably $1<n<9$ More preferably n is a natural number.

In a first even more preferred embodiment the value n is $1<n<8$.

In a second even more preferred embodiment the value n is $2<n<9$.

In a third even more preferred embodiment the value n is $2<n<8$.

In a fourth even more preferred embodiment the value n is $1<n<6$.

In a fifth even more preferred embodiment the value n is $2<n<6$.

The colorants $CA_1$ to $CA_n$ are chosen that one colorant $CA_1$ is red or yellow or orange or green or blue or violet, and that the other colorant $CA_2$ is red or yellow or orange or green or blue or violet but has a different colour than the colorant $CA_1$; and that the possible still another colorant $CA_3$ is red or yellow or orange or green or blue or violet but has a different colour than the colorant $CA_1$ and $CA_2$; and so on until colorant Cn.

In a first preferred embodiment, the colorants $CA_1$ to $CA_n$ are having all a different color.

The mixture of colorants $CA_1$ to $CA_n$ is preferably yielding to grey color. The mixture of colorants $CA_1$ to $CA_n$ is preferably having following values $20<L^*<80$, $-20<a^*<20$, $-20<b^*<20$, more preferably $30<L^*<70$, $-10<a^*<10$, $-10<b^*<10$, still more preferably $30<L^*<70$, $-5<a^*<5$, $-5<b^*<5$.

The three values L, a*, b* are used to characterize the principal color in the CIELAB system. L denotes the luminosity and extends from 0 (black) to 100 (white). The value a* measures the red and green of the color: the colors tending toward green have a negative a* value while those tending toward the red have a positive a* value. The b* value measures the blue and the yellow of the color: colors tending toward the yellow have a positive b* value while those tending toward the blue have a negative b* value. The L, a*, b* values are measured using a spectrum colorimeter (especially according to the ASTM E 308 standard).

The mixture of colorants $CA_1$ to $CA_n$ is chosen that, when blended with a transparent material as polymer P1, a sheet made of transparent material with colorants absorbs in a homogenous way over the whole spectrum of visible light between 400 nm and 700 nm. By homogenous is meant that the variation of the light transmission is small and varies only in an interval of less than 30% of absolute value. Preferably this variation is less than 25% and advantageously less than 20%. This is shown in FIG. 1 for example of (meth)acrylic polymer AP1. The highest value is 19%, the lowest value is 9%, which yields to a variation of 10% of the absolute value of light transmission.

Preferably the light transmission is between 5% and 40%, more preferably between 10% and 30% in a wavelength interval of 400 nm-700 nm for a sheet of (meth)acrylic polymer AP1 having 2 mm thickness comprising colorants $CA_1$ to $CA_n$.

Colorants for polymers are known and can be for example chosen from the product lines of the companies Lanxess, Clariant, Synthesia or BASF for pigments and dyes. There are the MACROLEX® dyes from Lanxess as Yellow 6G Gran, Yellow 3G Gran, Yellow G Gran, Yellow E2R Gran, Orange 3G Gran, Orange R Gran, Red E2G Gran, Red A, Red EG Gran, Red B, Red 5B Gran, Violet, 3R Gran, Violet B Gran, Blue 3R, Blue RR Gran, Green 5B Gran and Green G. There are the Solvaperm® dyes and Polysynthren® polymer colorants from Clariant as Yellow 3G, Yellow 2G, Orange 3G, Red 2G, Red G, RED PFS, RED BB, Red Violet R, Violet RSB, Blue 2B, Green, GSB, Green G, Yellow GG, Yellow NG, Red GFP, Violet G, Blue R, Blue RLS, Brown 3RL and Brown R.

The colorants are for example derivatives of methane, pyrazolone, quinophtalone, perinone, azo, anthraquinone, coumarine The colorants can be for example:

2,4-dihydro-5-methyl-2-phenyl-4-(phenylazo)-3H-pyrazol-3-one, CAS number[4314-14-1];

12H-phthaloperin-12-one, CAS number [6925-69-5];

8,9,10,11-tetrachloro-12H-phthaloperin-12-one, CAS number [20749-68-2];

3-hydroxy-N-(o-tolyl)-4-[(2,4,5-trichlorophenyl)azo]naphthalene-2-carboxamide, CAS number [6535-46-2];

1,4-diamino-2,3-diphenoxyanthraquinone, CAS number [6408-72-6];

1-hydroxy-4-(p-tolylamino)anthracene-9,10-dione, CAS number [81-48-3];

1,4-Bis(2,4,6-trimethylanilino)-9,10-anthraquinone, CAS number [116-75-6];

1,4-bis(p-tolylamino)anthraquinone [128-80-3].

The quantity of the colorants $CA_1$ to $CA_n$ in the polymeric composition PC1, is between 10 weight ppm and 10 000 weight ppm relative to the polymer P1, preferably between 20 weight ppm and 8000 weight ppm, more preferably between 50 weight ppm and 5000 weight ppm. The quantity of the respective colorants is chosen so that mixture of colorants $CA_1$ to $CA_n$ is preferably has a grey color, as defined before and that the mixture of colorants $CA_1$ to $CA_n$ when blended with a transparent material as polymer P1, a sheet made out of transparent material with colorants absorbs in a homogenous way over the whole spectrum of visible light between 400 nm and 700 nm, as also defined before.

The quantity of the colorant is chosen on function of its relative colour (tinting) strength. This value can be found in commercial brochures or material data sheets (according to DIN 53235 and expressed in SD⅓—reduced shade to international standard depth ⅓).

With regard to the colorants CB, of the second preferred embodiment the polymeric composition PC1 or the third preferred embodiment the polymeric composition PC1, it can be a pigment or a dye or a mixture of pigments and dyes. The pigment can be an inorganic pigment or an organic pigment. The colorant CB can be chosen from the same colorants as the colorants $CA_1$ to $CA_r$.

With regard to the process for the preparation a polymeric composition PC1 according to the invention, it comprises the steps of providing and blending the components a), b) and c).

More particularly process for manufacturing a polymeric composition PC1, said composition PC1 comprises:

a) a polymer P1, b) a polymeric particle PP1 having a weight average particle diameter between 1 μm and 100 μm, c) colorants $CA_1$ to $CA_n$.

characterized in that the colorant is mixture of colorants $CA_1$ to $CA_n$ with n>1 in the composition PC1;

said process comprises the step of i) providing:

a) a polymer AP1, b) polymeric particles PP1 having a weight average particle diameter between 1 μm and 100 μm, and c) the colorants $CA_1$ to $CA_n$ ii) blending the three components a), b) and c).

The blending can be made in any order: that the compound b) is added first to compound a) and afterward compound c) is added, or that compound c) is added first to compound a) and afterward compound b), or that compound b) and c) are added together at the same time.

Optionally the colorant CB is added.

Preferably the blending step ii) of the process is made by compounding or mixing.

The components a), b) and c) and their preferred embodiments are the same as defined before.

Said process for the manufacturing the polymeric composition PC1 uses preferably a masterbatch or liquid colour of colorants $CA_1$ to $CA_n$. The masterbatch or liquid colour comprises between 100 ppm by weight and 50% by weight of colorants.

In a first preferred embodiment of the process for the preparation a polymeric composition PC1 a masterbatch is used.

In a second preferred embodiment for the preparation a polymeric composition PC1 a liquid color is used. An example for liquid color concentrates is given in the document US2009/0156732.

According to a further aspect the present invention concerns a process for making an object by transforming and/or processing the polymeric composition PC1 according to the invention.

The transformation can be made by injection molding, coinjection, injection molding combined with surface molding, extrusion, coextrusion or extrusion/blow molding. Preferably the transformation is made by injection moulding or extrusion.

The transformation process has no influence on the luminous effect of the polymeric composition comprising polymeric particles and colorants namely the aspect contrast and/or color contrast which independent of the color of lighting source by using the same polymeric composition.

In a first preferred embodiment of the process for making an object is made by injection moulding. A moulded object is obtained.

The process for making a moulded object according to the invention comprises the steps of melting the polymeric composition PC1 comprising the polymer P1, the polymeric particles PP1 and the colorants injecting the molten composition into a mould applying pressure to the mould at least until the mould is completely filled with the molten composition.

In a second preferred embodiment of the process for making an object the transformation process is made by extrusion.

The process for making a moulded object according to the invention comprises the steps of feeding the polymeric composition PC1 comprising the polymer P1, the polymeric particles PP1 and the colorants into an extruder, melting the composition comprising a (meth)acrylic copolymer in the extruder extruding the molten composition.

In a third preferred embodiment of the process for making an object is made by injection moulding including overmolding.

According to a still further aspect the present invention concerns the use of the polymeric composition PC1 for making an object or a moulded object.

The composition PC1 according to the invention can be used for making an object or a moulded object or article or be used to be part of an article. Preferably the object or a moulded object or article or be used to be part of an article made out of the composition according to the invention has a thickness of more than 50 μm, more preferably more than 100 μm and even more preferably more than 500 μm.

The composition PC1 obtained by the process according to the invention can be used to be transformed directly into an article or object or can be part of an article or object.

According to a still further aspect the present invention concerns an object or a moulded object made of the polymeric composition PC1 according to the present invention.

The object or moulded object of the invention can be in form of a sheet, block, film, tube or profiled element. Preferably the moulded objects a sheet, which can be plain or slightly bent or curved.

Examples for object or molded objects or articles are covers or plates for luminous devices.

In one embodiment the molded object is a cover for a light source. The cover generally has a thickness of between 0.001 cm and 15 cm, preferably between 0.01 cm and 10 cm, more preferably between 0.05 cm and 7 cm, more preferably between 0.1 cm and 5 cm and even more preferably between 0.2 cm and 4 cm.

Additionally according to another aspect of the present invention the composition obtained from the polymeric composition PC1 according to the invention can used as a covering for a point light source. The light source plus cover forms a lighting device. The cover may be a single layer, or may be a multi-layer structure. The cover is separated from the light source by a distance of between 0.1 cm and 50 cm, preferably between 1 and 40 cm, preferably between 2 and 20 cm and even more preferably between 3 and 20 cm.

In still another embodiment a lighting device comprises the polymeric composition PC1 according to the invention.

The luminous device or lighting device comprises a light source. Preferably the light source is a LED. The light source can be a white or a coloured LED.

For a lighting device comprising a polymeric composition PC1 according to the first preferred embodiment of composition PC1, the light source can be a white or a coloured.

For a lighting device comprising a polymeric composition PC1 according to the second or third preferred embodiment of composition PC1, the light source is preferably a white light source.

The lighting device according to the invention has a variety of applications such as, for example:

- indoor lighting (ambient Lighting, living room lamps, office lamps, etc.);
- outdoor lighting (streetlamps, park or garden lamps);
- Lighting or displays for home appliances;
- Lighting or displays for Electric and Electronic goods advertising displays;
- illuminated signs (in this case, the cover may especially have the form of a letter, a number, a symbol or any other sign);
- industrial lighting;
- interior automotive lighting (signature lighting, ambient lighting, indication signs, instrument panel, interior displays);
- exterior automotive lighting for example the luminous device may be a headlamp, a day running light (DRL), a fog lamp, a rear lamp, a direction indicator, a stop light, a signature light or an external display.

[Methods]

The optical properties of the polymers are measured according to following method: light transmittance and haze are measured according to the standard ASTM D1003, sheets of 2 mm thickness for molded samples. A haze-gard plus apparatus from BYK-Gardner is used. The gloss is measured according to ASTM D523.

Refractive index is measured with a refractometer.

Particle size: the particle diameter is measured by Laser diffraction with a Coulter Counter.

The three values L, a*, b* are measured by color spectrometry by reflection if the light source is off and by transmission if the light source is lit on. A color spectrometer "Color Sphere" from BYK-Gardner is used.

EXAMPLES

A copolymer of methyl methacrylate having a melt flow index of 8 g/10 min is used as (meth)acrylic polymer AP1 for the polymer P1.

As a first polymeric particle PP1b, Paraloid EXL5137 from the company Röhm and Haas is used. The weight average particle diameter is between 4 μm and 6 μm and a batch having a weight average particle diameter of 5 μm was used.

As a second polymeric (meth)acrylic particle PP1a in the examples is used a commercial product from ALTUGLAS BS110 having generally a weight average particle diameter between 35 μm and 60 μm and a batch having a weight average particle diameter of 50 μm was used.

Colorants: the colorants are added in form of masterbatches: MBgris and MB Red 18242. The MBgris is a masterbatch having a grey color comprising three colorants CA1 to CA1.

Colorant CA1: Red Solvent 135 from BASF, CAS [20749-68-2], 8,9,10,11-tetrachloro-12h-phthaloperin-12-one Colorant CA2: Solvent Green 28 from BASF, CAS [28198-05-2], 1,4-bis[(4-butylphenyl)amino]-5,8-dihydroxy-anthracene-9,10-dione Colorant CA3: Violet solvent 13, CAS [81-48-3], 1-hydroxy-4-(p-tolylamino) anthracene-9,10-dione Colorant CB1 is a red masterbatch RED 18242.

The colorants CA1 to CA3 are blended together in a masterbatch MB1 at a weight level of 2500 ppm total colorants. This masterbatch MB1 is grey and if blended with a (meth)acrylic polymer AP1 at 3.7 phr, a sheet of 3 mm thickness has a light transmission between 10% and 20% over the wavelength interval of 400 nm-700 nm. This is shown in FIG. 1.

Example 1 and 2 have the composition given in table 1 blended with 3.7 phr of the grey masterbatch MB1. Example 3 and 4 have the same composition as examples 1 and 2 respectively but comprise additionally 1 phr of a masterbatch of colorant CB1. Comparative examples do not comprise any colorants.

TABLE 1 exemplified compositions of polymeric composition PC1 according to the invention and comparative compositions

| | Ex1 | Ex2 | Ex3 | Ex4 | CEx1 | CEx2 |
|---|---|---|---|---|---|---|
| AP1 | 82 | 82 | 82 | 82 | 82 | 82 |
| PP1a | 18 | 13 | 18 | 13 | 18 | 13 |
| PP1b | — | 5 | — | 5 | — | 5 |

i) Ex = Example, CEx = Comparative Example

The compositions of the respective samples are transformed to sheets 100 mm*100 mm and having a thickness of 2 mm and 3 mm.

These sheets are used as diffusing sheets in a cube of 100 mm*100 mm*100 mm containing four LED light sources, the LED light sources are positioned that they have a distances of 30 mm from the diffusing plate. The luminance or luminous emission is measured.

Figure 2:
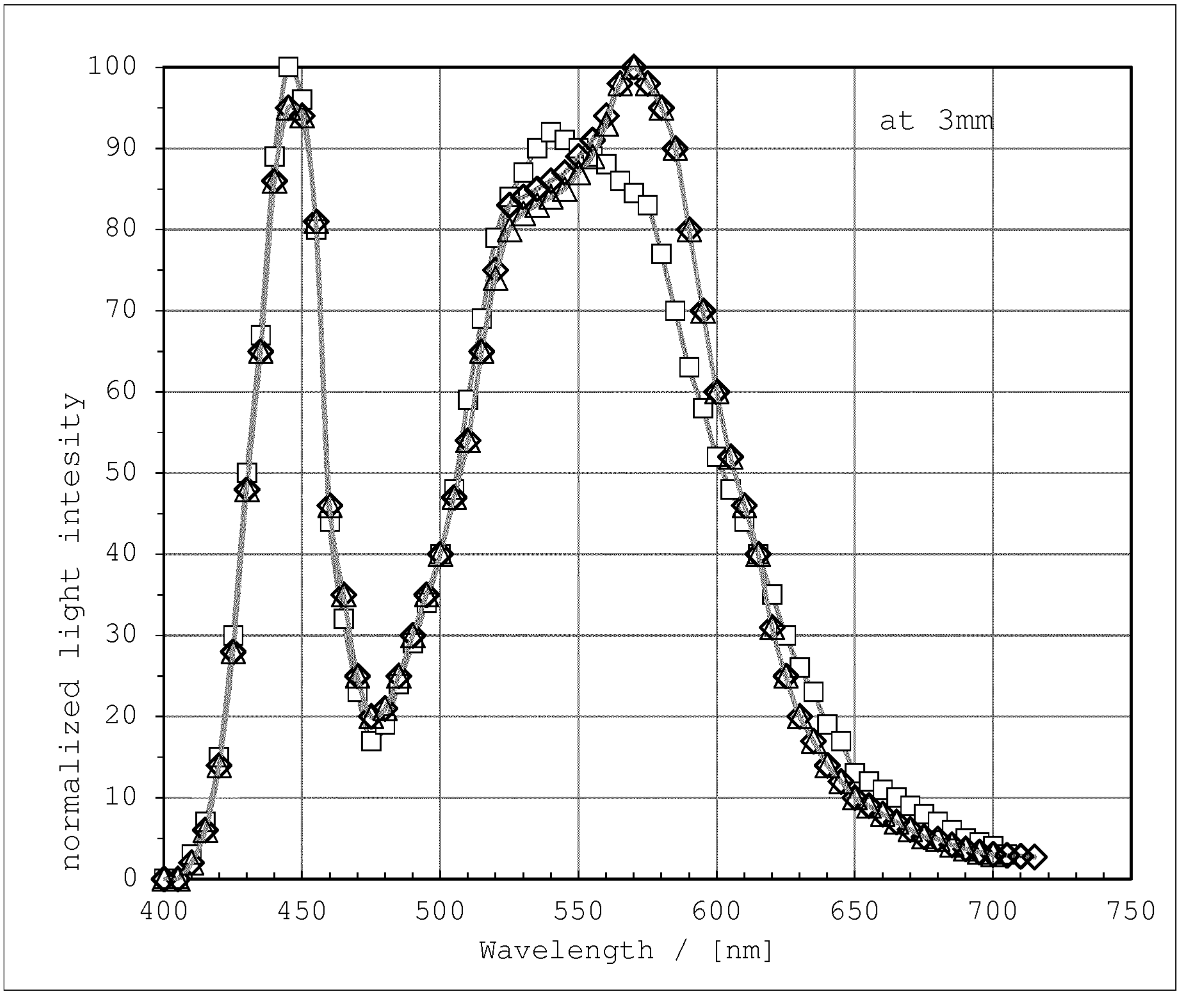

FIG. 2 shows a comparison of the spectrum of the light transmission of sheets of 3 mm of examples 1 (diamond) and 2 (triangle) and spectrum of the LED (square) normalized to 100 at peak. The figure proves that the spectrum of the LED is not influenced by the diffusing sheet and that the colour of the diffused light, either if white or coloured LED is used, is identical the colour of the light source.

Figure 3:
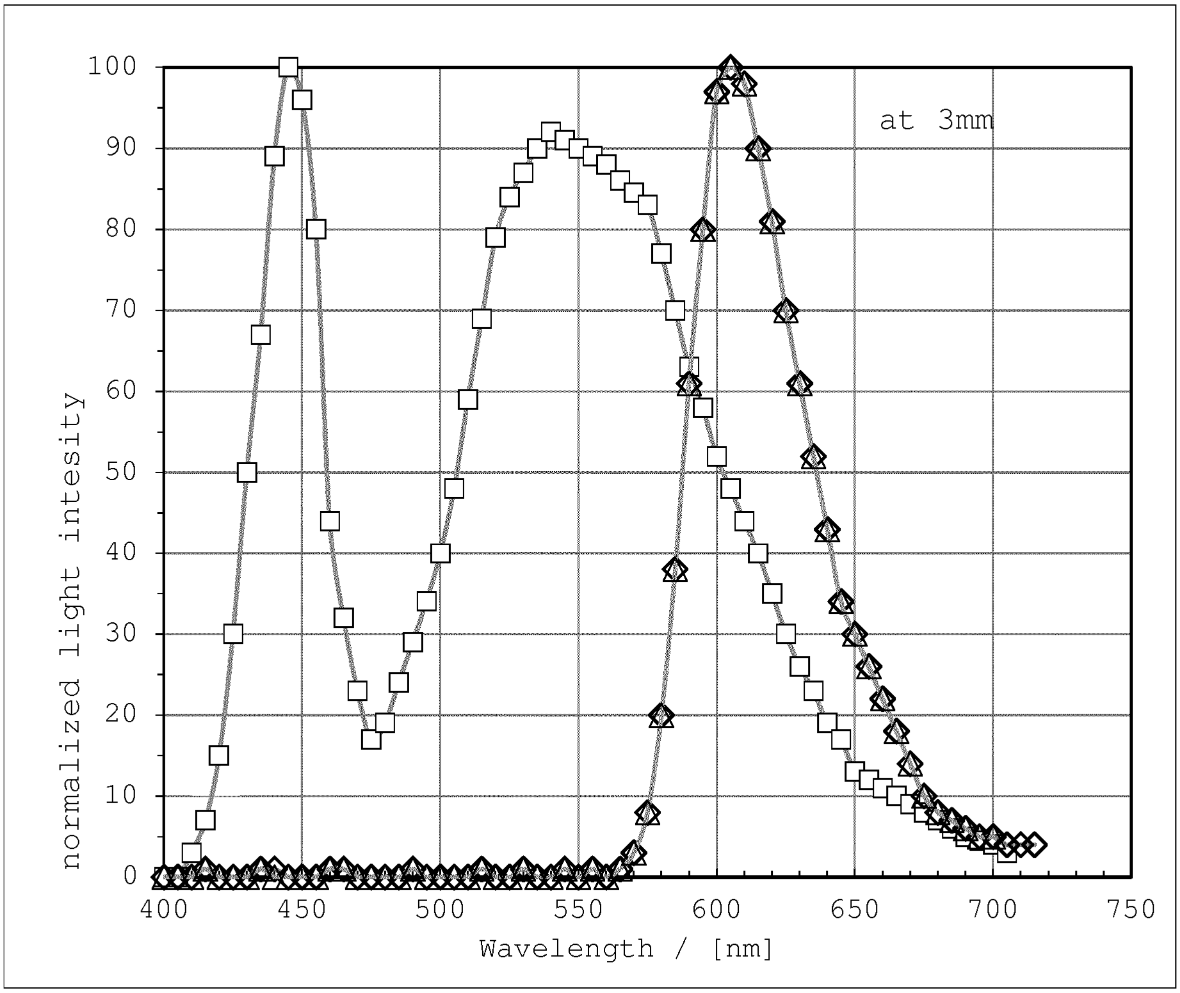

FIG. 3 shows a comparison of the spectrum of the light transmission of sheets of 3 mm of examples 3 (diamond) and 4 (triangle) and spectrum of the LED (square) normalized to 100 at peak. The figure proves that a red light is transmitted by the diffusing sheet if a white LED is used.

TABLE 2 transmittance mode for sample sheets of 2 mm thickness

| | Ex*1 | Ex*2 | Ex*3 | Ex*4 | CEx*1 | CEx*2 |
|---|---|---|---|---|---|---|
| L*Trans (D65/2°) | 59.5 | 54.8 | 27 | 25.3 | — | — |
| a*Trans (D65/2°) | −1.0 | −0.6 | 48.0 | 46.4 | — | — |
| b*Trans (D65/2°) | 0.8 | 1.5 | 43.3 | 41.4 | — | — |

TABLE 3 reflectance for sample sheets of 2 mm thickness

| | Ex*1 | Ex*2 | Ex*3 | Ex*4 | CEx*1 | CEx*2 |
|---|---|---|---|---|---|---|
| L*Reflect (D65/2°) | 27.1 | 26.2 | 23.7 | 23.7 | — | — |
| a* Reflect (D65/2°) | −0.4 | −0.3 | 2.7 | 2.3 | — | — |
| b* Reflect (D65/2°) | −0.6 | −0.7 | 0.4 | 0.2 | — | — |

TABLE 4 color shift for sample sheets of 2 mm thickness

| | Ex*1 | Ex*2 | Ex*3 | Ex*4 | CEx*1 | CEx*2 |
|---|---|---|---|---|---|---|
| ΔL* (D65/2°) | 32.3 | 28.6 | 3.3 | 1.7 | — | — |
| Δa* (D65/2°) | −0.6 | −0.3 | 45.3 | 44.1 | — | — |
| Δb* (D65/2°) | 1.4 | 2.2 | 42.9 | 41.2 | — | — |

For the examples 1 and 2 a significant variation of the lightness value L* together with a very low variation of colour components a* and b* is observed. This corresponds to a change from dark to bright.

For the examples 3 and 4 comprising the red colorant, a very low variation of the lightness value L* together with a very large variation of colour components a* and b* is observed. This corresponds to a nearly non visibility of the colour without any light source and a visible red colour when the light source is switched on.

TABLE 5 transmittance mode for sample sheets of 3 mm thickness

| | Ex*1 | Ex*2 | Ex*3 | Ex*4 | CEx*1 | CEx*2 |
|---|---|---|---|---|---|---|
| L*Trans (D65/2°) | 44.3 | 39.3 | 16.7 | 14.3 | 92.3 | 87.5 |
| a*Trans (D65/2°) | −1.2 | −0.7 | 38.5 | 35.6 | 0.5 | 0.7 |
| b*Trans (D65/2°) | 1.7 | 1.9 | 28.5 | 24.4 | 4.4 | 4.4 |

TABLE 6 reflectance for sample sheets of 3 mm thickness

| | Ex*1 | Ex*2 | Ex*3 | Ex*4 | CEx*1 | CEx*2 |
|---|---|---|---|---|---|---|
| L*Reflect (D65/2°) | 24.8 | 24.5 | 23.3 | 23.4 | 47.3 | 47.8 |
| a* Reflect (D65/2°) | −0.3 | 0.2 | 0.9 | 08 | 0.3 | 0.1 |
| b* Reflect (D65/2°) | −0.9 | −1.0 | −0.3 | −0.3 | 0.6 | 0.7 |

TABLE 7 colour shift for sample sheets of 3 mm thickness

| | Ex*1 | Ex*2 | Ex*3 | Ex*4 | CEx*1 | CEx*2 |
|---|---|---|---|---|---|---|
| ΔL* (D65/2°) | 19.5 | 14.8 | −6.6 | −9.1 | 45.1 | 39.7 |
| Δa* (D65/2°) | −0.8 | −0.5 | 37.5 | 34.8 | 0.1 | 0.6 |
| Δb* (D65/2°) | 2.6 | 2.9 | 28.8 | 24.7 | 3.8 | 3.6 |

The examples 1 to 4 show the same performance as the 2 mm thick sheets. The comparative examples for the 3 mm show already a high brightness, so that no change from dark to bright is obtained.

Also sheets of the compositions from examples 1 to 4 of 2 mm were prepared by extrusion, injection moulding and overmoulded injection moulding. The overmoulding was done with 1 mm a pure (meth)acrylic resin V825T from ALTUGLAS.

The gloss at 60° based according to norm ASTM D523 is measured.

TABLE 8 gloss at 60° for sample sheets of 2 mm or 3 mm thickness

| | Gloss at 60°/[GU] | | | |
|---|---|---|---|---|
| | Ex1 | Ex2 | Ex3 | Ex4 |
| Extruded sheet | 7 | 12 | 7 | 12 |
| Injected sheet | 33 | 29 | 35 | 36 |
| Injected and overmoulded sheet | 88 | 88 | 85 | 85 |

The examples in table 8 show that the gloss can be varied according to the transformation method of the composition according to the invention. Low gloss by extrusion, middle gloss by injection moulding In order to obtain a high gloss the samples have to be overmoulded.

The invention claimed is:

1. A polymeric composition (PC1) comprising:

(a) a (meth)acrylic polymer (AP1) comprising an amorphous (meth)acrylic copolymer comprising at least 50 wt % of methyl methacrylate in addition to monomers selected from methyl acrylate, ethyl acrylate, ethyl methacrylate, methacrylic acid and acrylic acid, (b) a polymeric particle (PP1) having a weight average particle diameter between 1 μm and 80 μm, the polymeric particle being a blend of two or more different (meth)acrylic particles, and (c) a mixture of colorants ($CA_1$) to ($CA_n$), wherein for the colorants ($CA_1$) to ($CA_n$), $2<n\leq6$ and the colorants are selected from 8,9,10, 11-tetrachloro-12H-phthaloperin-12-one;

3-hydroxy-N-(o-tolyl)-4-[(2,4,5-trichlorophenyl)azo]naphthalene-2-carboxamide;

1,4-diamino-2,3-diphenoxyanthraquinone;

1-hydroxy-4-(p-tolylamino)anthracene-9, 10-dione;

1,4-bis(2,4,6-trimethylanilino)-9, 10-anthraquinone; and 1,4-bis(p-tolylamino)anthraquinone, wherein the colorants ($CA_1$) to ($CA_n$) are present in the polymeric composition (PC1) in an amount of between 20 weight ppm and 8,000 weight ppm relative to the (meth) acrylic polymer (AP1), wherein the (meth)acrylic polymer (AP1) has a melt flow index of between 0.3 g/10 min and 16 g/10 min, wherein each particle of the two or more different (meth) acrylic particles is a homo-or copolymer of methyl methacrylate (MMA) that comprises at least 65% by weight of methyl methacrylate, wherein each particle of the two or more different (meth) acrylic particles has a refractive index between 1.49 and 1.56, wherein light transmission is between 10% and 30% in a wavelength interval of 400 nm-700 nm for a sheet of (meth)acrylic polymer (AP1) having 2 mm thickness comprising colorants $CA_1$ to $CA_n$, and variation of the light transmission varies in an interval of less than 30% of absolute value, and wherein the polymer particles (PP1) are present in an amount of between 0.8 wt % and 20 wt % of the composition (PC1) based on the sum of the two components (a) and (b).

2. The polymeric composition (PC1) according to claim 1, wherein the mixture of colorants has a grey colour.

3. A process for preparing the polymeric composition (PC1) according to claim 1, the process comprising:

i) providing:

(a) a (meth)acrylic polymer (AP1) comprising an amorphous (meth)acrylic copolymer comprising at least 50 wt % of methyl methacrylate in addition to monomers selected from methyl acrylate, ethyl acrylate, ethyl methacrylate, methacrylic acid and acrylic acid;

(b) a polymeric particle (PP1) having a weight average particle diameter between 1 μm and 100 μm, the polymeric particle being a blend of two or more different (meth)acrylic particles; and (c) a mixture of colorants ($CA_1$) to ($CA_n$), where $2<n\leq6$, and ii) blending (a), (b) and (c), wherein the mixture of colorants ($CA_1$) to ($CA_n$) are selected from 8,9,10, 11-tetrachloro-12H-phthaloperin-12-one;

3-hydroxy-N-(o-tolyl)-4-[(2,4,5-trichlorophenyl)azo] naphthalene-2-carboxamide;

1,4-diamino-2,3-diphenoxyanthraquinone;

1-hydroxy-4-(p-tolylamino)anthracene-9, 10-dione;

1,4-bis(2,4,6-trimethylanilino)-9, 10-anthraquinone; and 1,4-bis(p-tolylamino)anthraquinone, and wherein the colorants ($CA_1$) to ($CA_n$) are present in the polymeric composition (PC1) in an amount of between 20 weight ppm and 8,000 weight ppm relative to the (meth) acrylic polymer (AP1), wherein the (meth)acrylic polymer (AP1) has a melt flow index of between 0.3 g/10 min and 16 g/10 min, wherein each particle of the two or more different (meth) acrylic particles is a homo-or copolymer of methyl methacrylate (MMA) that comprises at least 65% by weight of methyl methacrylate, wherein each particle of the two or more different (meth) acrylic particles has a refractive index between 1.49 and 1.56, and wherein light transmission is between 10% and 30% in a wavelength interval of 400 nm-700 nm for a sheet of (meth)acrylic polymer AP1 having 2 mm thickness comprising colorants $CA_1$ to $CA_n$, and variation of the light transmission varies in an interval of less than 30% of absolute value and wherein the polymer particles (PP1) are present in an amount of between 0.8 wt % and 20 wt % of the composition (PC1) based on the sum of the two components (a) and (b).

4. A process for making an object by transforming and/or processing the polymeric composition (PC1) according to claim 1.

5. The process according to claim 4, wherein the transformation is made by injection molding, coinjection, injection molding combined with surface molding, extrusion, coextrusion or extrusion/blow molding.

6. The process according to claim 4, wherein the object is a lighting device, the process comprising:

i) providing a polymeric composition (PC1) according to claim 1;

ii) making a cover for the lighting device comprising polymeric composition (PC1); and iii) combining the cover with a light source.

7. A lighting device comprising the polymeric composition (PC1) according to claim 1.

8. The lighting device according to claim 7, comprising a LED as light source.

9. The lighting device according to claim 8, wherein the LED is a white LED.

10. The process according to claim 3, wherein a masterbatch or liquid colour of colorants ($CA_1$) to ($CA_n$) is used.

11. The polymeric composition (PC1) according to claim 1, wherein the blend of two or more different (meth)acrylic particles include particles having a weight average particle diameter of between 35 μm and 60 μm and different particles having a weight average particle diameter of between 4 μm and 6 μm.

* * * * *